United States Patent
Howald et al.

(10) Patent No.: US 6,265,831 B1
(45) Date of Patent: Jul. 24, 2001

(54) PLASMA PROCESSING METHOD AND APPARATUS WITH CONTROL OF RF BIAS

(75) Inventors: Arthur M. Howald, Pleasanton; John P. Holland, San Jose; Christopher Olson, Eldorado, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/281,808

(22) Filed: Mar. 31, 1999

(51) Int. Cl.$^7$ ............................... H01J 7/24; H05B 31/26
(52) U.S. Cl. .................... 315/111.21; 315/111.71; 118/723 I; 118/723 E; 118/723 AN
(58) Field of Search .................. 315/111.21, 111.31, 315/111.71; 156/345; 118/723 R, 723 I, 723 E, 723 AN

(56) References Cited

U.S. PATENT DOCUMENTS

| | | | |
|---|---|---|---|
| 4,622,094 | 11/1986 | Otsubo | 156/627 |
| 5,175,472 | 12/1992 | Johnson, Jr. et al. | 315/111.21 |
| 5,187,454 | 2/1993 | Collins et al. | 333/17.3 |
| 5,242,561 | 9/1993 | Sato | 204/192.33 |
| 5,472,561 | 12/1995 | Williams | 156/627.1 |
| 5,474,648 | 12/1995 | Patrick et al. | 156/345 |
| 5,556,549 | 9/1996 | Patrick et al. | 156/345 |
| 5,571,366 | 11/1996 | Ishii et al. | 118/723 I |
| 5,688,357 | 11/1997 | Hanawa | 156/345 |
| 5,689,215 | 11/1997 | Richardson et al. | 333/17.3 |
| 5,793,162 | 8/1998 | Barnes et al. | 315/111.21 |
| 6,197,116 | * 3/2001 | Kosugi | 156/345 |

FOREIGN PATENT DOCUMENTS

| | | | |
|---|---|---|---|
| 4180618 | * 6/1992 | (JP) | 315/111.21 |
| 98 47168 | 10/1998 | (WO) | |
| 99 14855 | 3/1999 | (WO) | |

OTHER PUBLICATIONS

Patent Abstracts of Japan, Publication No. 10154600, published Jun. 9, 1998 (abstract only).

F.Bose, R.Patrick, H.P.Baltes, Characterization of Plasma Etch Processes using Measurements of Discharge Impedance, J.Vac.Sci.Technol. B 12(4), Jul/Aug, 1994, pp. 2805–2809.

F.Bose, R.Patrick, H.Baltes, Measurement of Discharge Impedance for Dry Etch Process Control, SPIE vol. 2336, pp. 101–110.

Paul Rummel, Monitoring and Control of RF Electrical Parameters near Plasma Loads, Reprinted from Industrial Heating, May, 1991.

J.Bondur, T.R.Turner, Advanced Techniques for Integrated Circuit Processing, SPIE, vol. 1392, pp. 410–420.

J.W.Butterbaugh, L.D.Baston, H.H.Sawin, Measurement and Analysis of Radio Frequency Glow Discharge Electrical Impedance and Network Power Loss, J.Vac.Sci.Technol. A 8 (2), Mar/Apr. 1990, pp. 916–923.

Chris M. Horwitz, Radio Frequency Sputtering—The Significance of Power Input, J.Vac.Sci.Technol. A 1(4), Oct–Dec. 1983, pp. 1795–1800.

* cited by examiner

*Primary Examiner*—Michael B. Shingleton
(74) *Attorney, Agent, or Firm*—Lowe Hauptman Gilman & Berner, LLP

(57) ABSTRACT

A tendency for a discontinuity to occur in the amount of power reflected back to an r.f. bias source of a vacuum plasma processor is overcome by controlling the r.f. bias source output power so the power delivered to plasma in a vacuum processing chamber remains substantially constant. The r.f bias source output power is changed much faster than changes in capacitors of a matching network connecting the r.f. bias power source to an electrode of a workpiece holder processor. A capacitive impedance component of the plasma is determined by optically measuring the thickness of a plasma sheath in the chamber.

19 Claims, 3 Drawing Sheets

PLASMA PROCESSING METHOD AND APPARATUS WITH CONTROL OF RF BIAS

FIELD OF INVENTION

The present invention relates generally to vacuum plasma processors for processing workpieces on a workpiece holder and more particularly to a method of and apparatus for controlling an a.c. source coupled by a matching network to an electrode of the workpiece holder so a tendency for a discontinuity in the amount of power reflected back to the source is overcome by varying the source output power.

Another aspect of the invention relates to a method of and apparatus for determining an impedance component of a plasma in a plasma processor and more particularly to a method of and apparatus for determining the impedance component in response to thickness of a sheath between a solid surface of a vacuum chamber of the processor and the plasma in the chamber.

BACKGROUND ART

Vacuum processors for processing a workpiece (i.e., etching materials from or depositing materials onto the workpiece) typically include first and second ports respectively connected to a vacuum pump and one or more sources of ionizable gas. The gas is excited to a plasma in the chamber by an electric source including a reactance responsive to a first a.c. source, typically an r.f. or microwave source. A first matching network is usually connected between the first a.c. source and the reactance for exciting the plasma. If the source is an r.f. source, the reactance is either a coil for supplying magnetic and electric fields to the chamber interior via a dielectric window or a parallel plate capacitive arrangement for supplying an electrostatic field to the chamber interior.

The workpiece, which is typically a semiconductor wafer or a dielectric sheet or a metal plate, is clamped in place on a workpiece holder, i.e., chuck, that frequently includes an electrode covered by a dielectric. D.C. voltage is typically applied to the electrode to provide an electrostatic clamping force to hold the workpiece in situ on the holder. The workpiece is usually cooled by applying a coolant agent, such as helium, to a recess in the chuck. To accelerate ions in the plasma to the workpiece, a second a.c. source is connected to the electrode by way of a matching network. Each matching network includes a pair of variable reactances having values that are varied by motors, typically step motors.

Sensors for electric parameters associated with the plasma, as coupled to the excitation reactance and as coupled to the chuck electrode, derive signals which assist in controlling the values of the variable reactances. Pressure and flow rate transducers respectively in the chamber and in a line supplying gas to the second port derive signals which assist in controlling the vacuum pressure in the chamber and the flow rate of gas flowing into the chamber through the second port.

A controller including a microprocessor and a memory system including a hard drive, random access memory (RAM) and a read only memory (ROM), responds to the signals derived by the transducers and signals from an operator input console to produce signals for controlling the variable reactances, output power of the two a.c. sources, the vacuum pressure in the chamber and the flow rate of gases supplied to the chamber through the second port. The memory system stores several recipes, each in the form of signals representing various parameters controlling the deposition and etching of the workpieces for differing situations. The parameters of each recipe are, inter alia, gas species to be supplied to the chamber, flow rates of the species, vacuum pressure in the chamber and output powers of the two a.c. sources. Each recipe can include other parameters, such as a time for carrying out each recipe and/or the thickness of the layer being deposited. The controller responds to the parameters of the recipe to control valves for the flow of the gases into the chamber, the chamber pressure, as well as the output power of the first and second a.c. sources. During processing, the controller controls the reactances of the first and second matching networks so that there is an efficient transfer of power between the first and second a.c. sources and the loads they drive so the impedances seen looking into the output terminals of the first and second sources are substantially equal to the impedances the first and second sources respectively see by looking from their output terminals into cables connected to the first and second matching networks.

During processing, anomalies occur in the chamber pressure and gas flow rates. The anomalies affect the plasma impedance as coupled to the excitation reactance and the r.f. bias electrode. The controller responds to the plasma impedance changes resulting from these anomalies to change the reactances of the first and second matching networks in an attempt always to minimize the power reflected back to the output terminals of the first and second a.c. sources. Ideally, the reflected power is zero; in actuality the minimum power reflected back to the a.c. source driving the r.f. bias electrode is about two percent. The power absorbed by the loads driven by the first and second a.c. sources is maximized and the reflected power coupled back to the a.c. sources is minimized when the load impedance the source drives equals the complex conjugate of the impedance seen looking into the output terminals of the a.c. source. (The complex conjugate of $(A+jB)$ is $(A-jB)$, so that a load having an output represented by the real and imaginary components A and B, having a magnitude of $\sqrt{A^2+B^2}$ and a phase angle of $\theta = \arctan$ $$\frac{A}{B},$$

is matched when the load it drives has a magnitude of $\sqrt{A^2+B^2}$ and a phase angle of $-\theta$.

The sensing arrangement monitors how well the matching network is "tuned" to the load, i.e., the degree of match between the impedance seen looking into the output terminals of the r.f. source and the impedance seen looking into input terminals of a cable that the source drives and which in turn drives the matching network. The sensing arrangement can measure many different parameters, e.g., the impedance seen looking into the cable or the fraction of power reflected back to the a.c. generator output terminals. The controller responds to the sensing arrangement to continuously adjust the reactances of the matching network according to a feedback theory. Many different tuning theories have been developed for matching a plasma to an a.c. source, such as disclosed in the commonly assigned, U.S. Pat. Nos. 5,689,215 and 5,793,162.

In the past, the assumption has been that the measured quantity, either the impedance seen looking into the cable input terminals or the power reflected back to the output terminals of the a.c. source is a continuous function of the values of the variable reactances of the matching network. In other words, the prior assumption has been that a small change in either of the variable reactances results in a small change in the impedance seen looking into the cable or the reflected power. The assumption is true if the plasma load impedance is constant. However, the plasma load impedance is not constant, but instead is a function of a.c. power delivered to the plasma.

We have observed that small changes in the value(s) of at least one of the variable reactances of the matching network coupling power from the second source to the r.f. bias electrode can, under some circumstances, result in a step or discontinuous change in the impedance seen looking into the cable input terminals or the power reflected back to the second a.c. source output terminals. We believe the step or discontinuous change occurs because the plasma load impedance coupled to the r.f. bias electrode is not constant. Instead, the a.c. power the r.f. bias electrode delivers to the plasma apparently depends on the plasma load impedance, which in turn depends on the amount of a.c. power the r.f. bias electrode delivers to the plasma. The inter-dependency of the a.c. power the r.f. bias electrode delivers to the plasma and the plasma load impedance affects the delivered power and results in rapid or discontinuous changes in the impedance seen looking into the input terminals of the cable from the second a.c. source or the power reflected back to the second a.c. source.

The inter-dependency of delivered a.c. power and load impedance frequently prevents the prior art arrangements from maintaining a matched condition and operating properly. The discontinuity occurs at the most critical situation, such that a matching network which is operating to minimize the r.f. bias power reflected back to the second a.c. source has a large step change or discontinuity for a very small change in one of the matching network reactances. We have observed that the reflected r.f. bias power changes essentially from a zero amplitude to approximately eighty to ninety percent value with a change in matching network reactance (in ohms) associated with a one step change in the value of the reactance (e.g., in picofarads.) In other words, a very small change in one of the matching network reactances causes the reflected power to go from the idealized virtually zero reflected power state to a gross mismatch.

Such an abrupt change in the matched condition can have an adverse effect on the a.c. source driving the r.f. bias electrode. We have observed that such abrupt changes in the amount of reflected r.f. bias power cause spikes in plasma optical emission. The plasma emission optical spikes have been found to trigger an optical end pointer and cause workpiece etching to end prematurely.

It is, accordingly, an object of the present invention to provide a new and improved method of and apparatus for controlling the plasma of a plasma processor.

Another object of the invention is to provide a new and improved method of and apparatus for controlling the plasma of a plasma processor in such a way as to avoid the tendency for large or discontinuous changes to occur in energy reflected back to an a.c. source driving the plasma.

Another object of the present invention is to provide a new and improved method of and apparatus for preventing sudden changes in reflected energy or impedance seen by an a.c. excitation source driving an r.f. bias electrode as a result of a small change in a reactance of a matching network connected between the a.c. source and the r.f. bias electrode.

An additional object of the present invention is to provide a new and improved apparatus for and method of controlling a plasma of a plasma processor so that premature end pointing does not occur as a result of sudden changes in optical emission associated with sudden changes in power reflected back to an a.c. source driving an r.f. bias electrode via a matching network.

SUMMARY OF THE INVENTION

In accordance with one aspect of the invention a method of controlling an a.c. plasma treating a workpiece on a workpiece holder having an electrode in a vacuum plasma processing chamber is performed in accordance with a recipe including a set of parameters relating to a gas specie supplied to the chamber, a flow rate of gas supplied to the chamber, pressure in the chamber, power supplied to an excitation reactance for the plasma and power supplied to the electrode. The method comprises (1) supplying a.c. from a first a.c. source to the plasma via a first circuit including an excitation reactance and a first matching network including first and second variable reactances; (2) sensing a first function related to a load including the plasma as seen by the first circuit; (3) controlling the first and second reactances in response to the sensed first function to maintain a predetermined relation between functions of (a) the output impedance of the first source and (b) the impedance the first source drives; (4) supplying a.c. from a second a.c. source to the plasma via the electrode and a second matching network including third and fourth variable reactances; (5) sensing a second function related to the impedance of the plasma; and (6) controlling the third and fourth variable reactances in response to the sensed second function to maintain a substantially matched condition between the output impedance of the second source and the impedance the second source drives. The power reflected back to the second source has a tendency to have a step change as a result of a small variation in the value of at least one of the third and fourth reactances from the values of the third and fourth reactances which provide a match between the output impedance of the second source and the load the second source drives. The at least one small change results from an incremental change in at least one of the parameters while the value of the one parameter remains in a range associated with the recipe. The tendency for the step change is overcome by varying the output power of the second source in response to a function of plasma impedance. The second source output power changes at a speed much faster than the speed that the third and fourth reactances change to produce the tendency to have the step change.

In one preferred embodiment the function of plasma impedance which results in variations of the output power of the second source results from measurements of electric parameters seen by looking from the second source toward the matching network to obviate the need for a probe between the second match network and the electrode.

In another preferred embodiment the function of plasma impedance which results in the output power of the second source varying is a calculated value of plasma impedance coupled to the electrode. The calculated value of plasma impedance can be determined by measuring the impedance seen by: (1) looking into input terminals of the matching network; (2) determining the values of the impedances associated with the values of the third and fourth reactances; and (3) calculating the plasma impedance from (a) the measured impedance seen by looking into input terminals of the matching network, (b) the determined values of the impedances associated with the values of the third and fourth reactances at the time of measuring the impedance seen by looking into input terminals of the matching network, and (c) fixed values of impedances between the matching network input terminals and the electrode.

In another preferred embodiment the function of plasma impedance which results in the output power of the second source is a measure of power reflected back to output terminals of the second source. In such an instance, output power of the second source is determined, and there is control of the output power of the second source in response to a comparison of the power reflected back to output terminals of the second source and an indication of output power of the second source.

The function of plasma impedance which results in the output power of the second source can also be obtained from a measured value of impedance of the plasma as coupled to the electrode. The measured value of impedance of the plasma as coupled to the electrode can be derived from at least one electric parameter seen by looking from output terminals of the matching network into the electrode.

In one aspect of the invention, which can be used for purposes other than controlling output power of the second source, the measured value of impedance of the plasma is derived by measuring thickness of a sheath between a solid surface in the chamber and the plasma. Sheath thickness is correlated with the plasma load. The sheath thickness is preferably optically measured.

A further aspect of the invention is concerned with an apparatus for processing a workpiece. The apparatus comprises a vacuum plasma processor chamber having (a) a workpiece holder including an electrode for capacitively supplying an a.c. voltage to the workpiece, (b) a first port for supplying an ionizable gas to the chamber, (c) a second port for connecting a vacuum pump arrangement to the chamber. An excitation reactance supplies sufficient electric and magnetic energy to the ionizable gas to excite the gas to a plasma. A first matching network connected between a first a.c. source and the excitation reactance includes first and second variable reactances. A sensing arrangement responds to the plasma impedance. A second matching network connected between a second a.c. source and the electrode includes third and fourth variable reactances. A controller controls (a) the vacuum pump arrangement to control the vacuum in the chamber, (b) flow rate of gas supplied to the first port, (c) output power of the first a.c. source, (d) output power of the second a.c. source, (e) the first, second, third and fourth variable impedances. The controller includes an input device and a memory storing several recipes for different conditions in the chamber. Each recipe includes a set of parameters for preset values of the vacuum, flow rate, first source output power and second source output power. The controller responds to the input device for accessing the memory so the vacuum in the chamber, gas flow rate and output power of the first and second sources are at the preset values within predetermined ranges associated with a selected one of the recipes. The controller responds to the sensing arrangement for controlling (a) the first and second reactances to obtain a substantial impedance match between the first source and the impedance seen looking from the first matching network into the excitation reactance while the plasma is loading the excitation reactance and (b) the third and fourth reactances to obtain a substantial impedance match between the second source and the impedance seen looking from the second matching network into the electrode while the plasma is loading the excitation reactance electrode. The second source has a tendency to have a step change as a result of a small variation in the value of at least one of the third and fourth reactances from the values which provide a match between the output impedance of the second source and the load the second source drives. The small change results from an incremental change in at least one of the parameters while the one parameter remains in its range for the single set of parameters for the selected recipe. The controller responds to the sensing arrangement to overcome the tendency for the step change to occur by varying the output power of the second source in response to a function of plasma impedance. The second source output power is varied at a speed much faster than the speed that the third and fourth reactances change to produce the tendency to have the step change.

We are aware of the co-pending, commonly assigned application of Patrick et al. entitled "Methods and Apparatus for Controlling Ion Energy and Plasma Density in a Plasma Processing System" filed Apr. 16, 1997, and assigned Ser. No. 08/843,476. The co-pending application discloses a plasma processor including a coil for exciting gases in a vacuum plasma processing chamber to a plasma for processing a workpiece, such as a semiconductor wafer. The workpiece is mounted on a workpiece holder having an electrode supplied with r.f. via a matching network. Output power of the r.f. source driving the electrode supplies ionizing energy to the plasma. The output power of the r.f. source coupled to the electrode is controlled to maintain the d.c. voltage resulting from ionization of particles in the plasma substantially constant. A commercially available electrode arrangement monitors a d.c. bias voltage which results from ionization of the plasma by the r.f. source driving the electrode.

The inventors of the co-pending, commonly assigned application did not recognize the tendency for step-function variations to occur in reflected power when small variations in the reactances of the matching network occur at the time the matching network is adjusted so there is a substantial match between the impedance seen looking into the output terminals of the r.f. source and the impedance seen looking from the output terminals of the r.f. source toward the matching network, i.e., when there is a minimum amount of power reflected back to the r.f. source as associated with a matched condition. The apparatus of the co-pending, commonly assigned application essentially controls the d.c. bias voltage resulting from application of r.f. to the electrode of the workpiece holder.

The co-pending application fails to disclose the relative rates of controlling (1) power the r.f. bias source applies to the chuck electrode and (2) reactances of the matching network connected between the r.f. bias source and the chuck electrode. The inference is that the same computer program which controls the reactances controls the power the r.f. bias source applies to the chuck electrode. This means control of the reactances and the r.f. bias source power is at the same frequency. The disclosure of the co-pending application gives no reason why the control rates should differ.

Hence, the inferred operation of the Patrick et al. device is in contrast to the present invention which controls r.f. bias power at a much faster rate than control of the matching network reactances. In addition, the apparatus of the present invention essentially controls the impedance of the plasma, rather than the d.c. bias voltage. High speed control of the r.f. bias source is imperative to resolve the step function problem applicants have found occurs. Control of the plasma impedance rather than the d.c. bias voltage provides a greater degree of control of the workpiece processing.

Monitoring d.c. plasma bias voltage can only be done with an electrode in close proximity to the chamber. There are certain difficulties associated with monitoring electrical parameters in close proximity to the plasma which are overcome by measuring the parameters which control output power of the r.f. bias source in close proximity to the r.f. source.

Still another aspect of the invention relates to an apparatus for measuring a capacitive component of an electric load impedance of an a.c. plasma in a vacuum plasma processor. The load is coupled to an electric circuit supplying electric energy to the plasma. The plasma is such that a sheath is formed between a surface in the chamber and the plasma. The apparatus comprises a gauge for measuring thickness of the sheath and for deriving a response. A look-up structure responds to the response derived by the gauge for deriving a signal having a value correlated with the electric load impedance of the sheath. Preferably the gauge is an electro-optical device for monitoring and imaging the sheath thickness.

The electro-optical device, when used to monitor a capacitive impedance component of a sheath between the plasma and a workpiece on a workpiece holder, is arranged to have a field of view extending from a region between a point below a processed surface of the workpiece to a point above a boundary between the sheath and the plasma.

The above and still further objects, features and advantages of the present invention will become apparent upon consideration of the following detailed descriptions of several specific embodiments thereof, especially when taken in conjunction with the accompanying drawings.

DETAILED DESCRIPTION OF THE DRAWING

Figure 1:
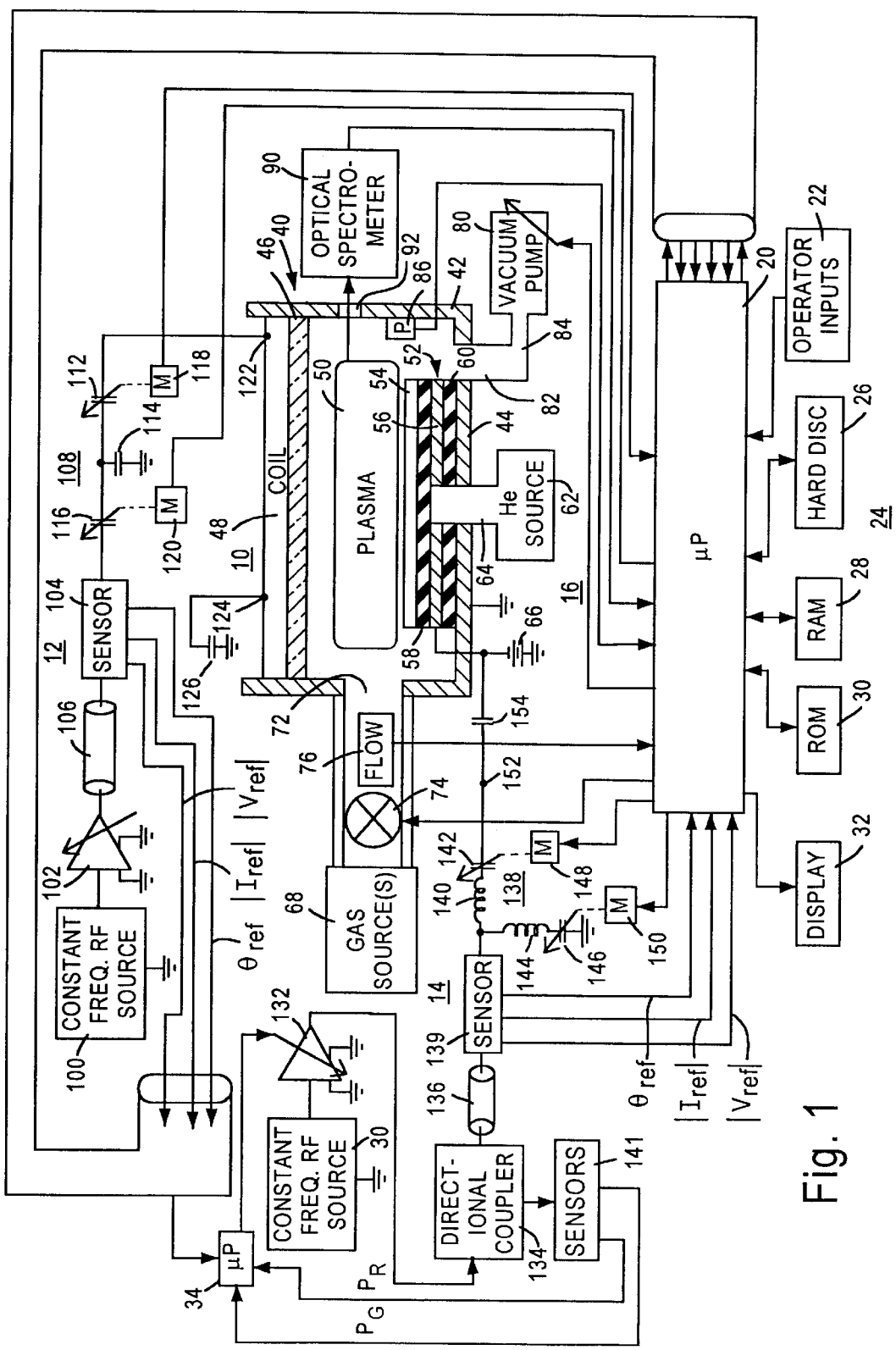
FIG. 1 is an overall block diagram of a plasma processor in accordance with a preferred embodiment of the present invention.

The workpiece processor illustrated in FIG. 1 includes vacuum plasma processing chamber assembly 10, a first circuit 12 for driving a reactance for exciting ionizable gas in chamber assembly to a plasma state, a second circuit 14 for applying r.f. bias to a workpiece holder in chamber assembly 10, and a controller arrangement 16 responsive to sensors for various parameters associated with chamber assembly 10 for deriving control signals for devices affecting the plasma in chamber assembly 10. Controller 16 includes microprocessor 20 which responds to various sensors associated with chamber assembly 10, as well as circuits 12 and 14, and signals from operator input 22, which can be in the form, for example, of a keyboard. Microprocessor 20 is coupled with memory system 24 including hard disk 26, random access memory (RAM) 28 and read only memory (ROM) 30. Microprocessor 20 responds to the various signals supplied to it to drive display 32, which can be a typical computer monitor.

Hard disk 26 and ROM 30 store programs for controlling the operation of microprocessor 20 and preset data associated with different recipes for the processes performed in chamber assembly 10. The different recipes concern gas species and flow rates applied to chamber assembly 10 during different processes, the output power of a.c. sources included in circuits 12 and 14, the vacuum applied to the interior of chamber assembly 10, and initial values of variable reactances included in matching networks of circuits 12 and 14.

The controller arrangement also includes a dedicated controller in the form of microprocessor 34 for controlling the output power of an r.f. bias source included in circuit 14 to control the output power of the r.f. bias source for circuit 14 virtually instantaneously, i.e., much faster than microprocessor 16 controls the devices it drives, i.e., the output power processor 34 controls the r.f. bias power at a rate at least an order of magnitude faster than microprocessor 20 controls its output signal;

for example, if microprocessor 20 controls its output signals once every twenty milliseconds, microprocessor 34 controls its output signal once every millisecond or faster.

Plasma chamber assembly 10 includes chamber 40 having metal, non-magnetic cylindrical side wall 42 and metal non-magnetic base 44, both of which are electrically grounded. Dielectric, typically quartz, window 46 is fixedly positioned on the top edge of wall 42.

Wall 42, base 44 and window 46 are rigidly connected to each other by suitable gaskets to enable a vacuum to be established within the interior of chamber 40. Planar plasma excitation coil 48, for example, as configured in Ogle, U.S. Pat. No. 4,948,458 or Holland et al., U.S. Pat. No. 5,759,280 sits on or in very close proximity to the upper face of window 46. Coil 46, an electric reactance, reactively supplies magnetic and electric r.f. fields to the interior of chamber 40, to excite ionizable gas in the chamber to plasma, schematically illustrated in FIG. 1 by reference numeral 50.

The upper face of base 44 carries holder 52 for workpiece 54, which is typically a circular semiconductor wafer, a rectangular dielectric plate such as used in flat panel displays or a metal plate. Workpiece holder 52 typically includes metal plate electrode 56 which carries dielectric layer 58 and sits on dielectric layer 60, which is carried by the upper face of base 44. A workpiece handling mechanism (not shown) places workpiece 54 on the upper face of dielectric layer 58. Workpiece 54 is cooled by supplying helium from a suitable source 62 to the underside of dielectric layer 58 via conduit 64 and grooves (not shown) in electrode 56. With workpiece 54 in place on dielectric layer 58, d.c. source 66 supplies a suitable voltage through a switch (not shown) to electrode 56 to clamp, i.e., chuck, workpiece 54 to holder, i.e., chuck, 52.

With workpiece 54 secured in place on chuck 52, one or more ionizable gases from one or more sources 68 flow into the interior of chamber 40 through conduit 70 and port 72 in sidewall 42. For convenience, only one gas source 68 is included in FIG. 1. The interior of conduit 70 includes valve 74 and flow rate gauge 76 for respectively controlling the flow rate of gas flowing through port 72 into chamber 40 and measuring the gas flow rate through port 72. Valve 74 responds to a signal microprocessor 20 derives, while gauge 76 supplies the microprocessor with an electric signal indicative of the gas flow rate in conduit 70. Memory system 24 stores for each recipe of each workpiece 54 processed in chamber 40 a signal indicative of desired gas flow rate in conduit 70. Microprocessor 20 responds to the signal memory system 24 stores for desired flow rate and the monitored flow rate signal gauge 76 derives to control valve 74 accordingly.

Vacuum pump 80, connected to port 82 in base 44 of chamber 40 by conduit 84, evacuates the interior of the chamber to a suitable pressure, typically in the range of one to one hundred milliTorr. Pressure gauge 86, in the interior of chamber 40, supplies microprocessor 20 with a signal indicative of the vacuum pressure in chamber 40.

Memory system 24 stores for each recipe a signal indicative of desired vacuum pressure for the interior of chamber 40. Microprocessor 20 responds to the stored desired pressure signal memory system 24 derives for each recipe and an electric signal from pressure gauge 86 to supply an electric signal to vacuum pump 80 to maintain the pressure in chamber 40 at the set point or predetermined value for each recipe.

Optical spectrometer 90 monitors the optical emission of plasma 50 by responding to optical energy emitted by the plasma and coupled to the spectrometer via window 92 in side wall 42.

Spectrometer 90 responds to the optical energy emitted by plasma 50 to supply an electric signal to microprocessor 20. Microprocessor 20 responds to the signal spectrometer 90 derives to detect an end point of the process (either etching or deposition) plasma 50 is performing on workpiece 54. Microprocessor 20 responds to the signal spectrometer 90 derives and a signal memory system 24 stores indicative of a characteristic of the output of the spectrometer associated with an end point to supply the memory with an appropriate signal to indicate that the recipe has been completed. Microprocessor 20 then responds to signals from memory system 24 to stop certain activities associated with the completed recipe and initiate a new recipe on the workpiece previously processed in chamber 40 or commands release of workpiece 54 from chuck 52 and transfer of a new workpiece to the chuck, followed by instigation of another series of processing recipes.

Excitation circuit 12 for driving coil 48 includes constant frequency r.f. source 100, typically having a frequency of 13.56 MHz. Source 100 drives variable gain power amplifier 102, typically having an output power in the range between 100 and 3000 watts. Amplifier 102 typically has a 50 ohm output impedance all of which is resistive and none of which is reactive. Hence, the impedance seen looking back into the output terminals of amplifier 102 is typically represented by (50+j0) ohms, and cable 106 is chosen to have a characteristic impedance of 50 ohms.

For any particular recipe, memory system 24 stores a signal for desired output power of amplifier 112. Memory system 24 supplies the desired output power of amplifier 102 to the amplifier by way of microprocessor 20. The output power of amplifier 102 can be controlled in an open loop manner in response to the signals stored in memory system 24 or control of the output power of amplifier 102 can be on a closed loop feedback basis, as known in the art and described, for example, in the aforementioned co-pending application.

The output power of amplifier 102 drives coil 48 via cable 106 and matching network 108. Matching network 108, configured as a "T," includes two series legs including variable capacitors 112 and 116, as well as a shunt leg including fixed capacitor 114. Coil 48 includes input and output terminals 122 and 124, respectively connected to one electrode of capacitor 112 and to a first electrode of series capacitor 126, having a grounded second electrode. The value of capacitor 126 is preferably selected as described in the commonly assigned, previously mentioned, Holland et al. patent. Electric motors 118 and 120, preferably of the step type, respond to signals from microprocessor 20 to control the values of capacitors 112 and 116 in relatively small increments to maintain an impedance match between the impedance seen by looking from the output terminals of amplifier 102 into cable 106 and by looking from cable 106 into the output terminals of amplifier 102. Hence, for the previously described (50+j0) ohm output impedance of amplifier 102 and 50 ohm characteristic impedance of cable 106, microprocessor 20 controls motors 118 and 120 so the impedance seen looking from cable 106 into matching network 108 is as close as possible to (50+j0) ohms.

To control motors 118 and 120 to maintain a matched condition for the impedance seen looking into the output terminals of amplifier 132 and the impedance amplifier 132 drives, microprocessor 20 responds to signals from conventional sensor arrangement 104 indicative of the impedance seen looking from cable 106 into matching network 108. Alternatively, sensors can be provided for deriving signals indicative of the power amplifier 102 supplies to its output terminals and the power reflected by matching network 108 back to cable 106. Microprocessor 20 responds, in one of several known manners, to the sensed signals sensor arrangement 104 derives to control motors 118 and 120 to attain the matched condition.

Because of variations in conditions in the interior of chamber 40 which affect plasma 50, the plasma has a variable impedance. The conditions are aberrations in the flow rate and species of the gas flowing through port 72, aberrations in the pressure in chamber 40 and other factors. In addition, noise is sometimes supplied to motors 118 and 120 causing the motors to change the values of capacitors 112 and 116. All of these factors affect the impedance reflected by the load including plasma 50 back to the output terminals of amplifier 102. Microprocessor 20 responds to the output signals of directional coupler 104 to control motors 118 and 120 to vary the values of capacitors 112 and 116 to maintain the impedance driven by the output terminals of amplifier 102 drives relatively constant. However, because the basic cycle time of microprocessor 20 is typically on the order of 20 milliseconds and several operating cycles are frequently required to restore a matched condition at the output terminals of amplifier 102, the response time of matching network 108 to these variations is usually at least 40 milliseconds.

Circuit 14 for supplying r.f. bias to workpiece 54 via electrode 56 has a construction somewhat similar to circuit 12. Circuit 14 includes constant frequency r.f. source 130, typically having a frequency such as 400 kHz, 2.0 mHz or 13.56 mHz. The constant frequency output of source 130 drives variable gain power amplifier 132, which in turn drives a cascaded arrangement including directional coupler 134, cable 136 and matching network 138. Matching network 138 includes a series leg comprising the series combination of fixed inductor 140 and variable capacitor 142, as well as a shunt leg including fixed inductor 144 and variable capacitor 146. Motors 148 and 150, which are preferably step motors, vary the values of capacitors 142 and 146, respectively, in response to signals from microprocessor 20.

Output terminal 152 of matching network 138 supplies an r.f. bias voltage to electrode 56 by way of series coupling capacitor 154 which isolates matching network 138 from the chucking voltage of d.c. source 66. The r.f. energy circuit 14 applies to electrode 56 is capacitively coupled via dielectric layer 48, workpiece 54 and a plasma sheath between the workpiece and plasma to a portion of plasma 50 in close proximity with chuck 52. The r.f. energy chuck 52 couples to plasma 50 establishes a d.c. bias in the plasma; the d.c. bias typically has values between 50 and 1000 volts. The d.c. bias resulting from the r.f. energy circuit 14 applies to electrode 52 accelerates ions in the plasma 50 to workpiece 54.

Microprocessor 20 responds to signals indicative of the impedance seen looking from cable 136 into matching network 138, as derived by a known sensor arrangement 139, to control motors 148 and 150 and the values of capacitors 142 and 146 in a manner similar to that described supra with regard to control of capacitors 112 and 116 of matching network 108. Hence, the minimum time for the smallest change in the values of capacitors 142 and 146 is one cycle time of microprocessor 20, 20 milliseconds in the above example.

For each process recipe, memory system 24 stores a set point signal for the net power flowing from directional coupler 134 into cable 136. The net power flowing from directional coupler 134 into cable 136 equals the output power of amplifier 132 minus the power reflected from the load and matching network 138 back through cable 136 to the terminals of directional coupler 134 connected to cable 136. Memory system 28 supplies the net power set point signal associated with circuit 14 to microprocessor 20, which in turn supplies the set point signal to microprocessor 34. Microprocessor 34 also responds to output signals directional coupler 134 supplies to power sensor arrangement 141. Power sensor arrangement 141 derives signals indicative of output power of amplifier 132 and power reflected by cable 136 back toward the output terminals of amplifier 132.

Microprocessor 34 operates at a considerably higher speed than each cycle time of microprocessor 20. Microprocessor 34 responds to the set point and measured signals sensor arrangement 141 derives, which measured signals are indicative of the output power is of amplifier 132 and the power reflected back to amplifier. Microprocessor 34 responds to its input signals to control the gain of amplifier 132. Amplifier 132 has an electronic gain control with a response time that is orders of magnitude faster than the response time of microprocessor 20 controlling motors 118 and 120 and capacitors 112 and 116. Hence, microprocessor 34 controls the gain of amplifier 132 much faster than microprocessor 20 controls changes in the values of capacitors 112 and 116. Microprocessor 34 can be replaced with an analog controller that instantaneously responds to analog output signals indicative of the power set point, the output power of amplifier 132 and the power reflected back to the amplifier by cable 136.

In one embodiment microprocessor 34 responds to the signals directional coupler 134 and microprocessor 20 supply to it to control the gain of amplifier 132 so the output power of amplifier 132 varies in accordance with: $P_{set}=P_G-P_R$, where $P_{set}$ is a set point power, $P_G$ is the output power of amplifier 132, and $P_R$ is the power reflected by the plasma back to the output terminals of amplifier 132 via matching network 138 and cable 136. Since the power losses in matching network 138, cable 136 and directional coupler 134 are virtually the same for any particular recipe, the reflected power monitored by directional coupler 134 is easily correlated with the power coupled between electrode 56 and plasma 50. The set point signal microprocessor 20 supplies microprocessor 34 includes compensation for these power losses for each recipe. Microprocessor 34 continuously controls the gain of amplifier 132 during the entire time while workpiece 54 is being processed in accordance with a particular recipe, i.e., until microprocessor 20 responds to the output of optical spectrometer 90 indicating an end point.

Figure 2:
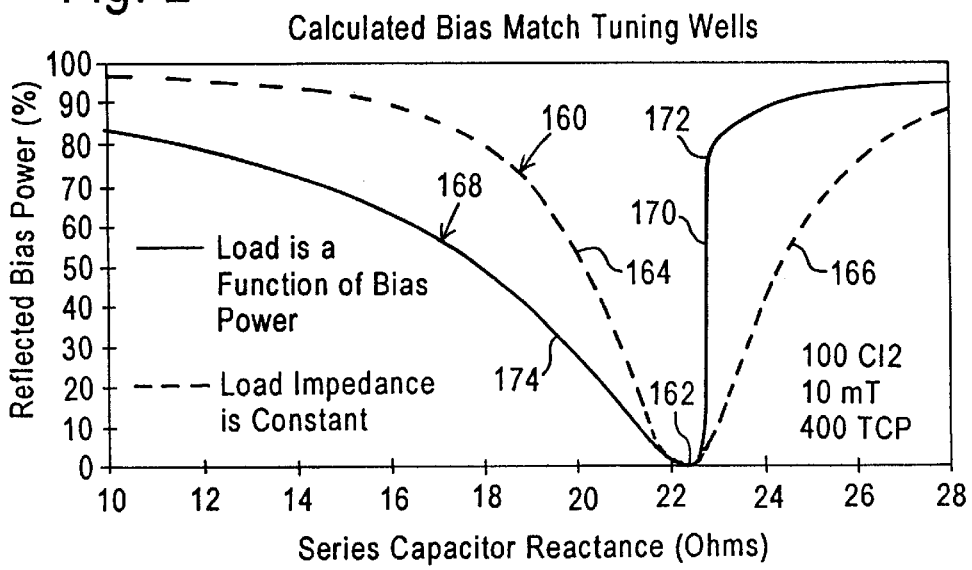
FIG. 2 includes plots of reflected bias power as a function of the value of a capacitance of a matching network connected between an a.c. source and an r.f. bias electrode in accordance with the prior art and a preferred embodiment of the present.

Controller 16 controls the gain of amplifier 132 continuously and with a much faster response time than the values of capacitors 142 and 146 to enable the capacitors to change values to approximate an idealized response curve for functions of power reflected back to the output terminals of amplifier 132 versus the values of capacitors 142 and 146. Dotted line curve 160, FIG. 2, is an idealized response curve relating the value of the reactance of series capacitor 142 of matching network 138 to reflected bias power, in percent, i.e, the percentage of power reflected back to the output terminals of amplifier 132 from plasma 50 and electrode 56 relative to the output power of amplifier 132; hence, reflected bias power (percent), in FIG. 2,=

$$100\frac{P_R}{P_G}.$$

As discussed supra, the set point signal microprocessor 20 supplies to microprocessor 34 includes fixed compensation for the reflected power signal directional coupler 134 supplies to microprocessor 34. The fixed compensation is determined by the losses of directional coupler 134, cable 136 and match network 138 for the particular recipe.

Idealized curve 160 is based on chlorine gas flowing through port 72 into chamber 40 at a rate of 100 standard cubic centimeters per minute (sccm) while pump 80 evacuates the interior of chamber 40 to 10 milliTorr and generator 102 has an output power of 400 watts. Curve 160 is also based on the premise that microprocessor 20 has activated motor 150 so shunt capacitor 146 has a value to enable virtually a perfect impedance match to be achieved between the impedance looking into the output terminals of amplifier 132 and the impedance the output terminals of amplifier 132 sees.

Curve 160 thus represents the reflected bias power in percentage as a function of the reactance of capacitor 142 in ohms. A similar curve exists for variations of capacitor 146 for each processing recipe of workpiece 54.

Curve 160 has a minimum value point 162, associated with a zero reflected power value when motor 148 adjusts capacitor 142 so the capacitor has a value associated with a reactance of 22.33 ohms. Ideally, curve 160 is approximately symmetric with respect to point 162. As microprocessor 20 and motor 148 adjust capacitor 142 so the capacitor has values associated with reactances which are greater and less than 22.33 ohms, the amount of power reflected back to the output terminals of amplifier 132 changes in a gradual and continuous manner as indicated by portions 164 and 166 of idealized response curve 160 that extend away from point 162 in opposite directions.

We have discovered, however, that the ideal situation depicted by curve 160, which assumes that the plasma load driven by amplifier 132 is constant, does not happen in actuality unless the control provided by microprocessor 34 is included. In particular, we have found that idealized response curve 160 does not occur when r.f. amplifier 132 delivers a constant amount of power to directional coupler 134. If the output power of amplifier 132 is not continuously controlled in a high-speed manner as discussed supra so it is equal to $P_G=P_{set}$, small changes in the values of one or both capacitors 142 or 146 from minimum reflection point 162 cause a discontinuous, i.e, step, variation in reflected bias power, as indicated by portion 170 of response curve 168. In particular, portion 170 of response curve 168 is a step, discontinuity between minimum reflection point 162 and point 172. In response to a minimum step change of the reactive value of capacitor 142 from 22.33 ohms (at point 162) to 22.4 ohms (at point 172), curve 168 jumps from a zero reflected bias power percentage to a reflected bias power percentage of approximately eighty-five percent. Hence, an enormous change occurs from a matched condition to a virtually completely mismatched condition in response to a minimum step change in the value of capacitor 142. A similar change occurs in response to a minimum change in the value of shunt capacitor 146.

We believe that the step change of waveform portion 170 occurs because of a non-linear relationship between the impedance plasma 50 couples to electrode 58 and the power the electrode delivers to the plasma. If the generator output power PG is constant, the reflected power PR is a triple-valued function of tuning capacitor value for some range of tuning capacitor values. The central of the three reflected power values is unstable, and the observed reflected power changes discontinuously from the lower to the higher value.

Curve 168 is very asymmetrical with respect to minimum reflected bias power point 162 such that portion 174 of curve 168 to the left of point 162 has a much smaller slope than wave portion 170. Portion 174 also has a smaller slope than the slope of either portion 164 or 166 of idealized response curve 160. We believe this is because the load of plasma 50 driven by electrode 56 is a function of the power supplied to electrode 56.

We have found that the occurrence of discontinuous portion 170 of response 168 results in large spikes in reflected bias power as a function of time and that these spikes are detrimental to processing of workpiece 54, particularly to the etch process. We have also found that these detrimental results can be overcome and that idealized response curve 160 can be achieved by continuously controlling, on a high-speed basis, the output power of amplifier 132 so it is in accordance with $P_S=P_G-P_R$, as discussed supra. Maintaining $P_S=P_G-P_R$ causes the power electrode 56 supplies to plasma 50 to remain constant. Maintaining the power electrode 56 supplies to plasma 50 constant maintains the plasma impedance substantially constant.

Figure 3:
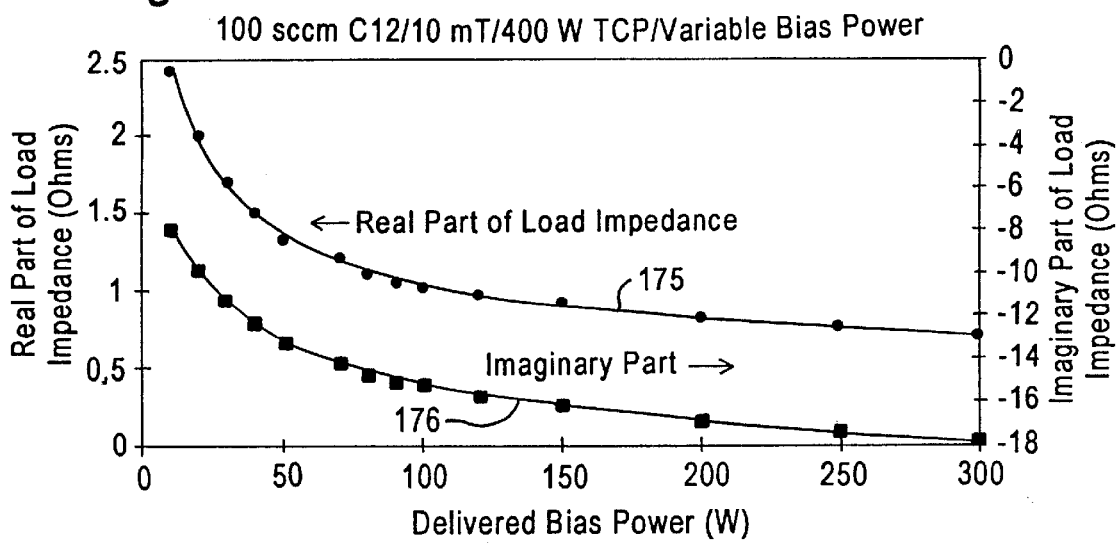
FIG. 3 includes response curves for real and imaginary plasma impedance components versus delivered power.

The relationship between power that electrode 56 delivers to plasma 50 and the real and imaginary parts of the plasma impedance are plotted in FIG. 3 and indicated by response curves 175 and 176. Response curves 175 and 176 respectively represent the real and imaginary parts of the plasma impedance (in ohms) coupled to electrode 56, as a function of delivered bias power. Each of response curves 175 and 176 is a smooth, continuous curve, having a relatively high value for low delivered bias power and a relatively low value for high delivered bias power. Response curves 175 and 176 represent actual measurements made in etching a polysilicon semiconductor wafer with $Cl_2$ flowing at 100 sccm into a vacuum chamber evacuated to 10 milliTorr and with a coil of the type disclosed in the commonly assigned Holland et al. patent driven with 400 watts. These are the same conditions that prevail for measurements associated with response curves 160 and 168, FIG. 2.

FIG. 3, indicates the real and imaginary parts of the impedance plasma 50 couples to electrode 56 remain constant if the power the electrode delivers to the plasma remains constant. Consequently, maintaining the power electrode 56 delivers to plasma 50 constant enables idealized response curve to be achieved and avoids the asymmetrical response curve 168 having step, discontinuous portion 170.

The apparatus of FIG. 1 monitors the reflected parameters at directional coupler 134, between the output of amplifier 132 and an end of cable 136 remote from matching network 138. This arrangement is advantageous because it avoids the necessity for electric monitoring probes in the lead between matching network 138 and electrode 56. It is to be understood, however, that many of the principles of the invention are equally applicable to monitoring load parameters in the lead connecting matching network 138 to electrode 56. Other devices and techniques can also be used to monitor the load impedance of plasma 50 on electrode 56.

Figure 4:
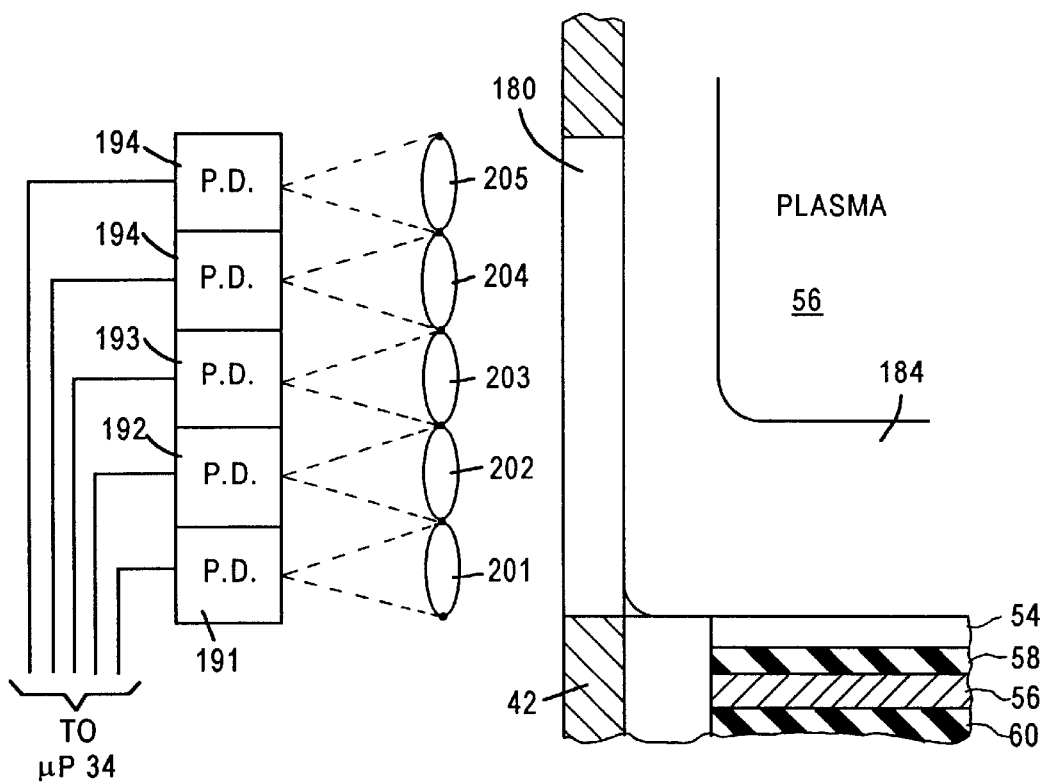
FIG. 4 is a side view of a vacuum plasma processing chamber with an optical imaging device for determining the thickness of a sheath, and thereby a capacitive impedance component of a plasma load on an r.f. bias electrode.

FIG. 4 is a schematic diagram of an arrangement for effectively monitoring the capacitive reactance of plasma 50 as coupled to workpiece 54. The principles associated with the device illustrated in FIG. 4 are applicable to effectively measuring capacitance between plasma 50 and any surface on the interior of chamber 40.

The arrangement of FIG. 4 is based on the principle that changes in capacitance of the load due to changes in plasma sheath thickness are primarily responsible for the asymmetrical response curve 168, including step or discontinuous portion 170, FIG. 2. Consequently, monitoring and controlling only the imaginary part of the load impedance plasma 50 presents to electrode 56 is frequently sufficient for control of the output power of amplifier 132 to achieve the relationship $P_S=P_G-P_R$. Stated differently, monitoring the thickness of the sheath between plasma 50 and workpiece 54 enables a signal indicative of the imaginary part of the plasma impedance to be attained. A signal indicative of the sheath thickness controls the output power of amplifier 132 to maintain the sheath thickness constant. Such operation results in approximate realization of idealized curve 160, FIG. 2, and prevents operation in conformance with asymmetrical response curve 168.

Since a plasma sheath is a dark area between the plasma and an adjacent surface of a vacuum chamber where the plasma is located, the plasma sheath has no optical emission. Hence, the thickness of the plasma sheath can be optically monitored by measuring the height of the dark area between workpiece 54 and optically emitting plasma 50 by using the apparatus illustrated in FIG. 4.

FIG. 4 includes optically transparent window 180 in sidewall 42 of chamber 40. Optical detector array 182, positioned outside of chamber 40 in alignment with window 180, detects the thickness of plasma sheath 184 between the bottom portion of plasma 50 and the upper face of workpiece 154. Array 182 includes five vertically arranged photodetectors 191–195, respectively coupled to lenticular lenses 201–205. Photodetectors 191–195 and lenses 201–205 are arranged so the field of view of photodetector 191 is effectively just above the top face of workpiece 54 and the field of view of photodetector 195 is just below the maximum expected thickness of sheath 184. Photodetectors 192–194 have fields of view between the fields of view of photodetectors 191 and 195.

Photodetectors 191–195 derive bi-level electrical outputs associated with whether the field of view associated with each photodetector includes or does not include emission from plasma 50. If plasma 50 is not in the field of view of a particular photodetector, the photodetector response is dark and is associated with the particular photodetector field of view imaging on sheath 184. Hence, the number of photodetectors 191–195 having a low output, associated with sheath 184 being in the field of view of a particular photodetector, indicates to a close approximation the thickness of sheath 184.

Memory system 24 includes a table look-up that stores signals correlating the sheath thickness indications derived by photodetectors 191–195 with the capacitance of the sheath above workpiece 54. Photodetectors 191–195 supply bi-level signals to microprocessors 24 and 34 to thus indicate the thickness of sheath 184. The capacitance microprocessor 20 responds to the signals of memory system correlating the sheath thickness indications derived by photodetectors 191–195 with the capacitance of the sheath above workpiece 54 and the sheath thickness signals photodetectors 191–195 derive to calculate a signal indicative of sheath capacitance. Microprocessor 20 supplies the signal indicative of sheath capacitance to display 32.

Memory system 24 also stores signals representing the resistive and reactive impedances in the circuitry between the output terminals of amplifier 132 and workpiece 54 (for different values of capacitors 140 and 146) and a program for calculating the capacitive impedance between the output terminals of amplifier 132 and workpiece 54. Memory system 24 also stores a signal indicative of desired (set point) capacitive impedance for each recipe. Microprocessor 20 responds to the program and signals in memory system 24 representing the resistive and reactive impedances in the circuitry between the output terminals of amplifier 132 and workpiece 54 (for different values of capacitors 140 and 146) and the signal indicative of desired (set point) capacitive impedance to calculate a set point signal related to desired output power of amplifier 132 as a function of the height of sheath 184.

Microprocessor 34 responds to the signals from photodetectors 191–195 and to the set point signal for the thickness of sheath 184 microprocessor 20 supplies to microprocessor 34. The set point signal is a function of the instantaneous values of capacitors 142 and 146 and the particular recipe of the workpiece 54 being processed. Microprocessor 34 includes a control program for the gain of amplifier 132 as a function of the sheath height set point signal microprocessor 20 derives and the measured sheath height, as indicated by the signals photodetectors 191–195 derive. Microprocessor 34 responds to the signals from photodetectors 191–195 and the sheath height set point signal microprocessor 20 derives to control the output power of amplifier 132 by varying the gain of amplifier 132.

It is to be understood that FIG. 4 includes five photodetectors for illustrative purposes only. In actuality, considerably more than five photodetectors are required to provide the desired resolution. Alternatively, the thickness of sheath 184 can be monitored by using a continuous photodetector strip having a field of view that is same as photodetectors 191–195 and resistance determined by the thickness of sheath 184. In such a case, an analog to digital converter converts the resistance of the strip into a digital signal that drives microprocessor 34. It is also to be understood that the various gauges and measuring devices supply signals to microprocessors 20 and 34 in analog form and that the microprocessors convert these analog signals into digital signals. The microprocessors also include digital to analog converters, as necessary, to drive various devices illustrated in FIG. 1, such as valve 74 and vacuum pump 80.

While there have been described and illustrated specific embodiments of the invention, it will be clear that variations in the details of the embodiments specifically illustrated and described may be made without departing from the true spirit and scope of the invention as defined in the appended claims.

We claim:

1. A method of controlling an a.c. plasma treating a workpiece in a vacuum plasma processing chamber, the workpiece being on a workpiece holder having an electrode, the method being performed in accordance with a recipe having a set of parameters including at least one gas supplied to the chamber, flow rate of the gas supplied to the chamber, pressure range in the chamber, power range supplied to an excitation reactance for the plasma and power range supplied to the electrode, the method comprising supplying a.c. from a first a.c. source to the plasma via a first circuit including an excitation reactance and a first matching network including first and second variable reactances, sensing a first function related to a load including the plasma as seen by the first circuit, controlling the first and second reactances in response to the sensed first function to maintain a predetermined relation between functions of (a) the output impedance of the first source and (b) the impedance the first source drives, supplying a.c. from a second a.c. source to the plasma via the electrode and a second matching network including third and fourth variable reactances, sensing a second function related to the impedance of the plasma, controlling the third and fourth variable reactances in response to the sensed second function to maintain a substantially matched condition between the output impedance of the second source and the impedance the second source drives, power reflected back to the second source having a tendency to have a step change as a result of a small variation in the value of at least one of the third and fourth reactances from the values which provide a match between the output impedance of the second source and the load the second source drives, the at least one small change resulting from an incremental change in at least one of the parameters while the one parameter remains in a range consistent with the recipe, and overcoming the tendency for the step change by varying the output power of the second source in response to a function of plasma impedance, the second source output power being varied at a speed much faster than the speed that the third and fourth reactances change to produce the tendency to have the step change.

2. The method of claim 1 wherein the function of plasma impedance which results in the output power of the second source varying results from measurements of electric parameters seen by looking from second source toward the matching network.

3. The method of claim 1 wherein the function of plasma impedance which results in the output power of the second source varying is a function of plasma impedance coupled to the electrode.

4. The method of claim 3 further including measuring the impedance seen by looking into input terminals of the matching network, determining the values of the impedances associated with the values of the third and fourth reactances, and calculating the plasma impedance from (a) the measured impedance seen by looking into input terminals of the matching network, (b) the determined values of the impedances associated with the values of the third and fourth reactances at the time of measuring the impedance seen by looking into input terminals of the matching network and (c) fixed values of impedances between the matching network input terminals and the electrode.

5. The method of claim 1 wherein the function of plasma impedance which results in varying the output power of the second source is power reflected back to output terminals of the second source, determining output power of the second source, and controlling the output power of the second source in response to a comparison of the power reflected back to output terminals of the second source, an indication of output power of the second source and a set point for power to be applied to the plasma.

6. The method of claim 1 wherein the function of plasma impedance which results in varying the output power of the second source is a measured value of an impedance component of the plasma as coupled to the electrode.

7. The method of claim 6 wherein the measured value of impedance component of the plasma as coupled to the electrode is derived from at least one electric parameter looking into input terminals of the matching network.

8. The method of claim 6 wherein the measured value of impedance component of the plasma as coupled to the electrode is derived by measuring thickness of a sheath between the holder and the plasma and correlating sheath thickness with the load of the plasma as coupled to the second matching network.

9. The method of claim 8 wherein the sheath thickness is measured optically.

10. The method of claim 1 wherein the excitation reactance includes a coil.

11. Apparatus for processing a workpiece comprising
   a vacuum plasma processor chamber having (a) a workpiece holder including an electrode for electrostatically supplying electric energy to the workpiece, (b) a first port for supplying an ionizable gas to the chamber, (c) a second port for connecting a vacuum pump arrangement to the chamber;
   an excitation reactance for supplying sufficient electric and magnetic energy to the ionizable gas to excite the gas to a plasma;
   a first a.c. source;
   a first matching network connected between the first a.c. source and the excitation reactance, the first matching network including first and second variable reactances;
   a sensing arrangement responsive to the plasma impedance;
   a second a.c. source;
   a second matching network connected between the second a.c. source and the electrode, the second matching network including third and fourth variable reactances;
   a controller for (a) the vacuum pump arrangement to control the vacuum in the chamber, (b) flow rate of gas supplied to the first port, (c) output power of the first a.c. source, (d) output power of the second a.c. source, and (e) the values of the first, second, third and fourth variable impedances, the controller including an input device and a memory storing several recipes for different conditions in the chamber, each recipe including a set of parameters for preset values of the vacuum, flow rate, first source output power and second source output power, the controller responding to the input device for accessing the memory for causing the vacuum in the chamber, gas flow rate and output power of the first and second sources to be at the preset values within predetermined ranges associated with a selected one of the recipes, the controller responding to the sensing arrangement for (a) controlling the first and second reactances to obtain a substantial impedance match between the first source and the impedance seen looking from the first matching network into the excitation reactance while the plasma is loading the excitation reactance and (b) controlling the third and fourth reactances to obtain a substantial impedance match between the second source and the impedance seen looking from the second matching network into the electrode while the plasma is loading the excitation reactance electrode;
   the power reflected back to the second source having a tendency to have a step change as a result of a small variation in the value of at least one of the third and fourth reactances from the values which provide a match between the output impedance of the second source and the load the second source drives, the at least one small change resulting from an incremental change in at least one of the parameters while the one parameter remains in its range for the single set of parameters for the selected recipe;
   the controller being arranged for responding to the sensing arrangement for overcoming the tendency for the step change by varying the output power of the second source in response to a function of plasma impedance, the second source output power being variable at a speed much faster than the speed that the third and fourth reactances change to produce the tendency to have the step change.

12. The apparatus of claim 11 wherein the function of plasma impedance which results in the output power of the second source varying results from measurements of electric parameters seen by looking from second source toward the matching network.

13. The apparatus of claim 11 wherein the function of plasma impedance which results in the output power of the second source varying is a calculated value of plasma impedance coupled to the electrode.

14. The apparatus of claim 11 wherein the function of plasma impedance which results in varying the output power of the second source is power reflected back to output terminals of the second source, the sensing arrangement being arranged for deriving a signal indicative of output power of the second source, the controller being arranged for controlling the output power of the second source in response to a comparison of the power reflected back to output terminals of the second source and the signal indicative of output power of the second source.

15. The apparatus of claim 11 wherein the function of plasma impedance which results in varying the output power of the second source is a measured value of impedance of the plasma as coupled to the electrode.

16. The apparatus of claim 15 wherein the measured value of impedance component of the plasma as coupled to the electrode is derived from at least one electric parameter looking into input terminals of the matching network.

17. The apparatus of claim 15 wherein the measured value of impedance component of the plasma as coupled to the electrode is derived by a gauge for measuring thickness of a sheath between the holder and the plasma.

18. The apparatus of claim 17 wherein the gauge is arranged for measuring sheath thickness optically.

19. The apparatus of claim 11 wherein the excitation reactance includes a coil.

* * * * *